United States Patent [19]

Coulbourn, Jr.

[11] 4,194,209

[45] Mar. 18, 1980

[54] BROADBAND WAVEGUIDE LENS ANTENNA AND METHOD OF FABRICATION

[75] Inventor: Charles B. Coulbourn, Jr., Rolling Hills Estates, Calif.

[73] Assignee: The United States of America as represented by the Secretary of the Air Force, Washington, D.C.

[21] Appl. No.: 866,187

[22] Filed: Dec. 30, 1977

[51] Int. Cl.[2] .......... H01L 19/06

[52] U.S. Cl. .......... 343/753; 343/910

[58] Field of Search .......... 343/909-911 R, 343/753, 754, 756

[56] References Cited

U.S. PATENT DOCUMENTS

| | | | |
|---|---|---|---|
| 2,547,416 | 4/1951 | Skellett | 343/910 |
| 2,599,763 | 6/1952 | Kock | 343/910 |
| 2,640,154 | 5/1953 | Kock | 343/910 |
| 2,729,816 | 1/1956 | Crawford | 343/909 |
| 2,736,894 | 2/1956 | Kock | 343/910 |

*Primary Examiner*—David K. Moore

*Attorney, Agent, or Firm*—Joseph E. Rusz; Willard R. Matthews, Jr.

[57] ABSTRACT

Increased bandwidth in a waveguide lens antenna is achieved by altering the geometry of the stepped antenna guide plates in a manner that causes the net contribution of the antenna phase dispersion sources to result in zero average aperture phase error. Design equations are included for the fabrication of waveguide lens antenna having any desired degree of phase compensation. In principle, the plate geometry is configured to effect a given relationship between the components of phase error due to guide plate dispersion and the component of phase error due to the guide plate steps. When these components are equal and opposite zero average aperture phase error (maximum bandwidth operation) is achieved.

1 Claim, 13 Drawing Figures

BROADBAND WAVEGUIDE LENS ANTENNA AND METHOD OF FABRICATION

STATEMENT OF GOVERNMENT INTEREST

The invention described herein may be manufactured and used by or for the Government for governmental purposes without the payment of any royalty thereon.

BACKGROUND OF THE INVENTION

The invention relates to waveguide lens antennas and in particular to means for increasing the bandwidth of such antennas and to design techniques that permit the fabrication of antennas having any desired degree of phase compensation.

Broadband wavelength lenses of the type comprehended by the invention are of primary interest for multiple-beam antennas operating at microwave frequencies. Multiple-beam antennas, in general, consist of an aperture (such as a lens or parabolic reflector) which focusses r.f. energy radiated by one or more elements in a feed array. Normally, a feed array consists of a large number of radiating elements, usually 19 or more.

Most types of r.f. focussing apertures, such as parabolic reflectors, reflectarrays, and certain types of lenses, commonly used for communications and radar applications, are not suitable for multiple-beam antennas. For instance, the normally-large array of feed elements result in excessive aperture blockage of center-fed parabolic reflectors. This blockage results in loss of efficiency and degradation of pattern shape. Parabolic reflectors with offset feeds do not suffer such blockage, but they do have very poor beam scanning characteristics and are hence undesirable for multiple-beam antenna application. Reflectarrays, which are reflecting arrays of elements which focus energy from one or more broad-beam feed elements, have the same general weaknesses as parabolic reflectors. Luneburg lenses and bootlace lenses have good bandwidth and beam scanning characteristics; however, they have poor physical characteristics, such as excessive weight and structural complexity. Others, such as waveguide lenses of previous design, have good physical characteristics but poor electrical characteristics (such as limited bandwidth). In fact, there is no r.f. focussing aperture currently available that is completely satisfactory for multiple-beam antennas operating over the X-band communications band.

Accordingly, there currently exists the need for a broadband waveguide lens that offers substantial improvement over those previously available. It is desirable that such a lens make possible the achievement of certain important capabilities from multiple-beam antennas having simple, lightweight structures. One such capability is the formation of nulls in broadcoverage patterns (formed by turning on many single contiguous beams). Such nulls must be well-shaped and capable of being formed and maintained over a substantial bandwidth. The present invention is directed toward providing and improved broadband waveguide lens antenna having such a capability.

SUMMARY OF THE INVENTION

Waveguide lens antennas include electromagnetic wave energy guide plates that are stepped from a center region to each end with the center region and the several stepped regions forming zones. An aperture phase error is introduced to the transmitted electro-magnetic wave energy by phase dispersive effects resulting from a component of phase error due to dispersion from the guide plates and from a component of phase errors due to the steps. The aperture phase error is manifested as a wave front that is other than planar and the condition of zero apertures phase error (or a planar wave front) represents a maximum bandwidth condition. The invention achieves a maximum bandwidth by configuring the guide plate steps in a manner that makes the two phase error sources contribute equal and opposite phase error components. The invention also comprehends a method for designing lenses having any desired amount of phase compensation (controlled aperture phase error). Design equations are presented that may be used to implement these techniques.

It is a principal object of the invention to provide a new and improved waveguide lens antenna.

It is another object of the invention to provide new and improved methods for fabricating waveguide lens antennas.

It is another object of the invention to provide a method of designing a waveguide lens antenna having any desired amount of phase compensation.

It is another object of the invention to provide a high quality performance broadband waveguide lens having a much less complex and lighter weight structure than a bootlace type lens.

It is another object of the invention to provide a new and improved broadband waveguide lens that maintains the good structural characteristics of state of the art waveguide lenses while providing greatly improved bandwidth performance.

These, together with other objects, features and advantages of the invention will become more apparent from the following detailed description taken in conjunction with the accompanying drawings.

DESCRIPTION OF THE DRAWINGS

FIG. 5*c* is a curve illustrating the phase error from the lens steps for the lens of FIG. 5*a.

DESCRIPTION OF THE PREFERRED EMBODIMENT

Figure 1A:
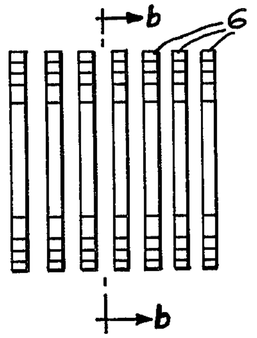
FIG. 1*a* is a front view of the broadband waveguide lens of the invention.
Figure 1B:
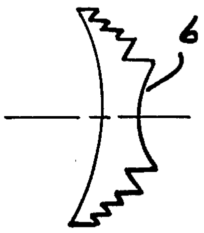
FIG. 1*b* is a sectional view of the lens of FIG. 1*a* taken at b—b.
Figure 2:
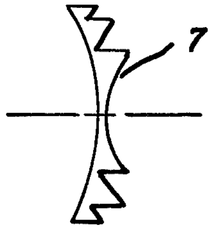
FIG. 2 PRIOR ART
FIG. 2 is a sectional view of a prior art waveguide lens.

The present invention comprises a new type of r.f. waveguide lens which provides a substantially larger frequency-bandwidth than waveguide lenses of previous designs. The improved performance is achieved with minimal penalty in the desirable structural characteristics of previous-design waveguide lenses. FIG. 1*a* illustrates a waveguide lens of the type comprehended by the invention and comprises a parallel arrangement of conductive plates 6. FIGS. 1*b* and 2 show, for comparison, the cross-sectional shape of the broadband waveguide lens described herein (plate 6 of FIG. 1) and a waveguide lens of previous design, respectively.

In order to focus, or collimate, r.f. energy, a lens must transform the spherical phase front, from a point source, to a planar phase front. Proper focussing is maintained over all frequencies for which this transformation holds, that is, for as long as the focussed phase front remains planar. When lens frequency-sensitivity results in an imperfect phase transformation, defocussing results.

Figure 3:
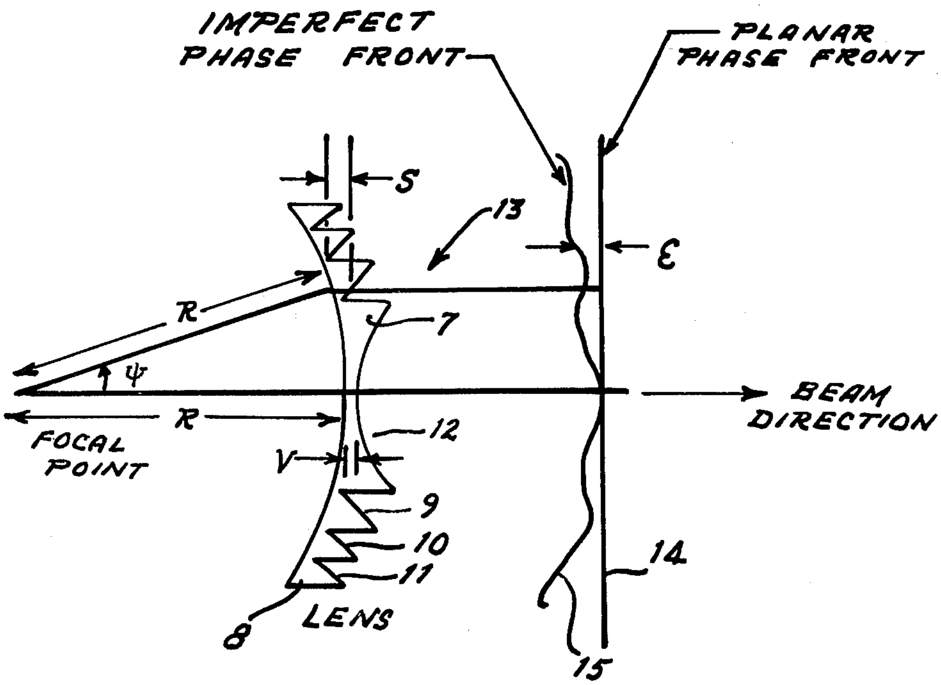
FIG. 3 is a schematic illustration of a waveguide lens including a transmitted beam and wavefronts.

Focussed and defocussed conditions of a stepped waveguide lens are illustrated in FIG. 3 in which a lens 8 having a center region 12 and steps 9, 10 and 11 is illustrated schematically with a beam 13, planar phase front 14 and imperfect phase front 15. When a focussed condition exists, the relative phase between any point in an arbitrary plane normal to the beam direction and a single reference point at the feed is constant, i.e. there is a planar phase front (phase front 14). When a defocussed condition exists, the relative phase is not constant but rather varies in some manner over the aperture, and there is an imperfact phase front (phase front 15). The difference in actual phase and a constant phase constitutes an aperture phase error, $\epsilon$, as shown schematically in FIG. 3.

An expression for the value of the aperture phase error, $\epsilon$, can be derived by considering that the optical path lengths between the focal point and any point on the phase front must differ only by whole numbers of wavelengths. Such an expression has been derived using the terminology of FIG. 3, and is $$\epsilon = |(R \operatorname{Cos} \psi + S - + V\eta) - (R + \eta S) + J\lambda| \frac{360}{\lambda}. \quad (1)$$

or, $$\epsilon = |[(S - V) - R(1 - \operatorname{Cos} \psi)] - [\eta(S - V)] + [J\lambda]| \frac{360}{\lambda} \text{ degrees.}$$

where

R = focal length, $\psi$ = angle at intersection of general ray and antenna axis, S = lens thickness at the point where the general ray passes through, V = lens thickness along the axis, $\eta$ = refractive index of the lens, J = zone number (J = 0 for the center zone), and $\lambda$ = free space wavelength.

The terms in equation 1 are divided into three groups, each enclosed by square brackets. The first group consists of terms which are independent of frequency. The second group contains one frequency dependent term, $\eta$, the refractive index of the waveguide lens. The third group accounts for the lens steps and contains a wavelength term. Thus, it is seen that a stepped waveguide lens has two sources of frequency sensitiveness: the dispersive characteristics of the waveguide sections and the dispersion due to the waveguide steps.

At the design frequency, $f_o$, the lens parameters are normally selected such that $\epsilon$ equals zero, and equation 1 reduces to $$[(S - V) - R(1 - \operatorname{Cos}\psi)] = [\eta_o(S - V)] - [J\lambda_o], \quad (2)$$

where $\eta_o$ = refractive index at the design frequency, and $\lambda_o$ = freespace wavelength at the design frequency.

Substitution of this into equation 1 gives the phase error, $\epsilon$, at the operating wavelength $\lambda$.

$$\epsilon = [\eta_o(S - V) - J\lambda_o - \eta(S - V) + J\lambda] \frac{360}{\lambda} \text{ degrees.}$$

After terms are rearranged, $$\epsilon = [(S - V)(\eta_o - \eta) + J(\lambda - \lambda_o)] \frac{360}{\lambda} \text{ degrees, or} \quad (3)$$

$$\epsilon = \epsilon_\eta + \epsilon_J, \quad (3a)$$

where $$\epsilon_\eta = (S - V)(\eta_o - \eta) \frac{360}{\lambda} \text{ degrees,} \quad (4)$$

$$\epsilon_J = J(\lambda - \lambda_o) \frac{360}{\lambda} \text{ degrees,} \quad (5)$$

and $\eta$ = refractive index at the operating frequency, and $\lambda$ = freespace wavelength at the operating frequency.

Equation 4 gives the component of phase error due to the dispersive nature of the waveguide sections and equation 5 gives the component of error caused by the lens steps.

Figure 4A:
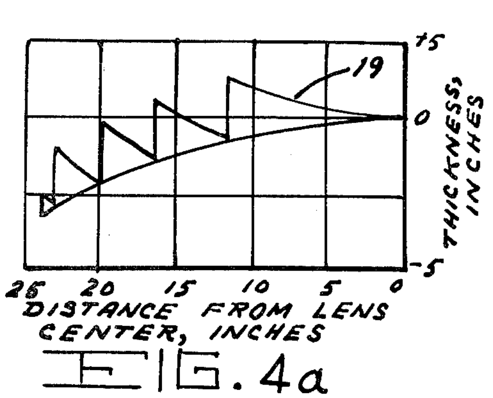
FIG. 4*a* is a partial cross sectional view of a prior art waveguide lens.
Figure 4B:
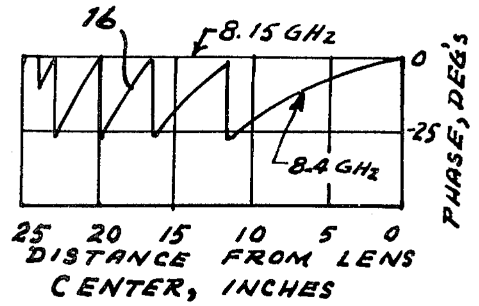
FIG. 4*b* is a curve illustrating the phase error from waveguide dispersion for the lens of FIG. 4*a;*
Figure 4C:
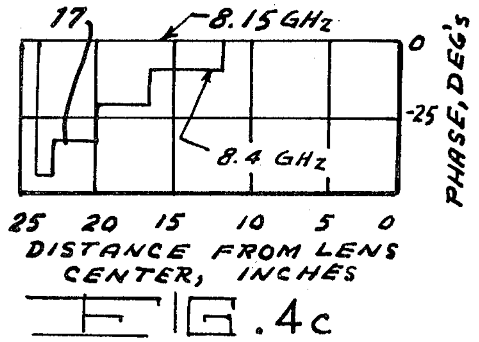
FIG. 4*c* is a curve illustrating the phase error from the lens steps for the lens of FIG. 4*a;*
Figure 4D:
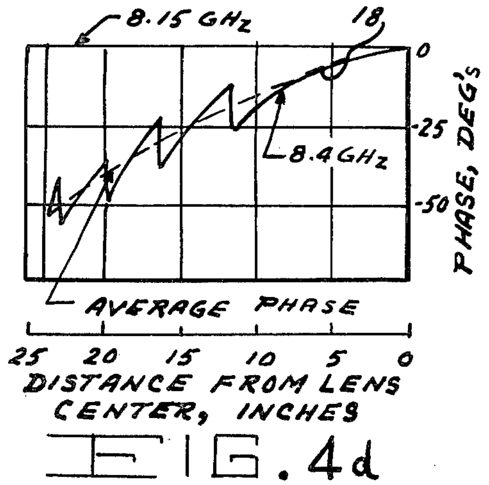
FIG. 4*d* is a curve illustrating the total phase error for the lens of FIG. 4*a;*

These components of phase error have been plotted as curves 16 and 17 in FIGS. 4*b* and 4*c* respectively for a waveguide lens 19 of previous design having the design parameters $f_o$=8.15 GHz, $\eta_o$=0.640, $f_{max}$=8.4 GHz, $\eta_{max}$=0.667, and F/D=1. The cross section of this lens is shown in FIG. 4*a* and the total phase error is plotted as curve 18 in FIG. 4*d*. At the design frequency, each phase error equals zero; at band edge each is other than zero, as shown. It should be noted that the average value, indicated by a dotted line, of the total aperture phase error is approximately 50 degrees at band edge.

Figure 5A:
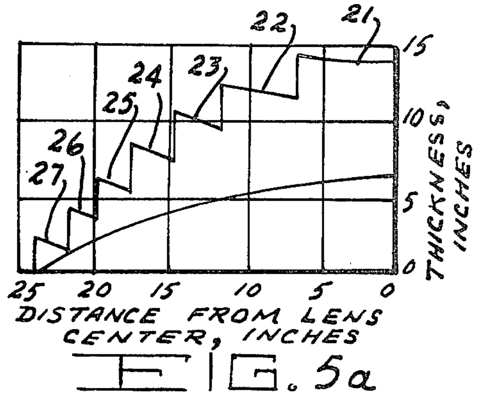
FIG. 5*a* is a partial cross sectional view of the broadband waveguide lens of the present invention.
Figure 5B:
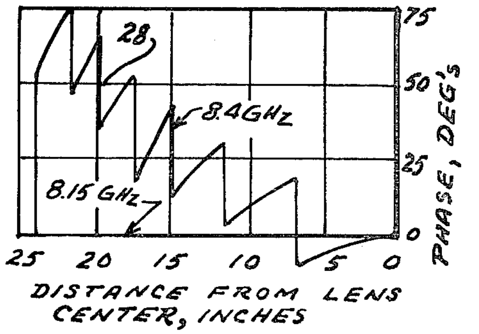
FIG. 5*b* is a curve illustrating the phase error from waveguide dispersion for the lens of FIG. 5*a;*
Figure 5C:
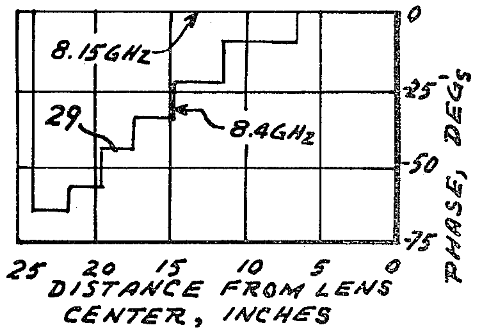
Figure 5D:
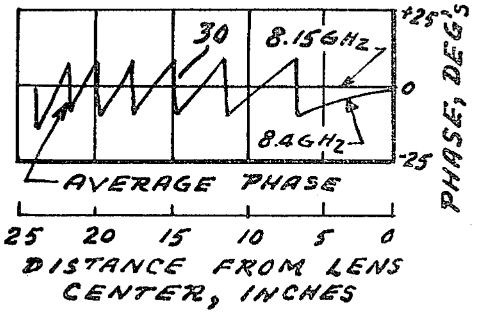
* and FIG. 5*d* is a curve illustrating the total phase error for the lens of FIG. 5*a.*

An average aperture phase error of near zero can be achieved over a given band of frequencies by properly locating the lens steps so that the two components of aperture phase error cancel each other at band edge as well as at band center. This has been done, with new lens characteristics as shown in FIGS. 5*a*–5*d*. The design parameter for this lens are $f_o$=8.15 GHz, $\eta_o$=0.5, $f_o$ max=8.4, $\eta$max=0.542, and F/D=1. FIG. 5*a* shows the lens 21 having steps 22–27. The components of phase error have been plotted as curves 28 and 29 in FIGS. 5*b* and 5*c* respectively. The total phase error is plotted as curve 30 in FIG. *d*. The step locations have been selected so that positive excursions of the total phase error equal the negative excursions, and hence the average phase error is zero. The physical size of each step does not change; therefore, the phase error at the design frequency remains at zero.

The position of steps for any arbitrary average phase error, $\epsilon_{ave}$, (including zero) at each step can be determined by specifying that at band edge, $$\epsilon_{ave} = \frac{\epsilon(J) + \epsilon(J+1)}{2} \quad (6)$$

where $\epsilon$(J)=total phase error at the outer radius of the Jth zone, and $\epsilon$(J+1)=total phase error at the inner radius of the $(J+1)^{th}$ zone. J=0 within the center zone. The total phase error at the outer radius of the $J^{th}$ zone, from equation 3, is $$\epsilon(J) = |[S(J) - V][\eta_o - \eta] + J(\lambda - \lambda_o)| \frac{360}{\lambda} \text{ degrees} \quad (7)$$

and at the inner radius of the $(J+1)^{th}$ zone, it is $$\epsilon(J+1) = |[S(J+1) - V][\eta_o - \eta] + [J+1][\lambda - \lambda_o]| \frac{360}{\lambda} \text{ degrees} \quad (8)$$

where

S(J)=lens thickness at the outer radius of the $J^{th}$ zone, and

S(J+1)=lens thickness at the inner radius of the $(J+1)^{th}$ zone.

Substituting equations 7 and 8 into 6 gives the average phase error at each step.

$$\epsilon_{ave} = \frac{360}{2\lambda} [[\eta_o - \eta][|S(J) - V| + |S(J)+1) - V|] + [2J+1][\lambda - \lambda_o]] \text{degrees} \quad (9)$$

The physical thickness of the lens can be derived from equation 2; at the outer edge of the $J^{th}$ zone, it is $$[S(J) - V] = \frac{R[1 - \text{Cos}\,\psi(J)] - J\lambda_o}{1 - \eta_o}. \quad (10)$$

At the inner edge of the (J+1)th zone, the thickness is $$[S(J+1) - V] = \frac{R[1 - \text{Cos}\,\psi(J+1)] - [J+1]\lambda_o}{1 - \eta_o} \quad (11)$$

where $\psi$(J)=$\psi$(J+1).

The average phase error at each step as a function of the step position, $\psi$(J), is obtained by substituting equations 10 and 11 into 9.

$$\epsilon_{ave} = \frac{360}{2\lambda}\left\{ [\eta_o - \eta]\left[\frac{2R\,|1 - \text{Cos}\,\psi(J)| - |2J+1|\lambda_o}{1 - \eta_o}\right] + [2J+1][\lambda - \lambda_o] \right\} \text{ degrees.}$$

-continued

Conversely, the step position, $\psi$(J), for a given average phase error, $\epsilon_{ave}$, at the step is $$\psi(J) = \text{Cos}^{-1}\left\{ \frac{1}{2R}\left[\left\{ [2J+1][\lambda - \lambda_o] - \frac{\lambda\epsilon_{ave}}{180} \right\}\left\{ \frac{1 - \eta_o}{\eta_o - \eta} \right\} - |2J + I|\lambda_o\right] + 1 \right\} \text{ degrees.} \quad (12)$$

The distance, $\rho$, of the step from lens center is $\rho$=R Sin $\psi$(J)

where

R=focal length

If the average phase error, $\psi\epsilon_{ave}$, is zero degrees (for perfect compensation), equation 12 reduces to $$\psi(J) = \text{Cos}^{-1}\left\{ \left[\frac{2J+1}{2R}\right]\left[|\lambda - \lambda_o|\left|\frac{1 - \eta_o}{\eta_o - \eta}\right| - \lambda_o\right] + 1 \right\} \text{ degrees.} \quad (14)$$

While the invention has been described in one presently preferred embodiment, it is understood that the words which have been used are words of description rather than words of limitation and that changes within the preview of the appended claims may be made without departing from the scope and spirit of the invention in its broader aspects.

I claim:

1. A broadband waveguide lens antenna having a multiplicity of spaced juxtaposed electromagnetic waveguide plates and having an aperture phase error characteristic $$\epsilon = |[(S - V) - R(1 - \text{Cos}\psi)] - [\eta(S - V)] + [J\lambda]| \frac{360}{\lambda} \text{ degrees,}$$

wherein R=focal length, $\psi$=angle at intersection of general ray and antenna axis, S=lens thickness at point of general ray passage, V=lens thickness along its axis, $\eta$=lens refractive axis, V=zone number, $\lambda$=free space wavelength, each waveguide plate being formed to have multiple steps, each said step defining a zone and being configured and dimensioned such that the componenets of phase error due to waveguide plate dispension $\epsilon_n$ is equal to and opposite the components of phase error due to waveguide plate geometric configuration $\epsilon_u$ for each said zone, $\epsilon_n$ being defined as $\epsilon_n$=(S−V) ($\eta_o$−$\eta$) (360/$\lambda$) degrees, and $\epsilon_j$ being defined as $\epsilon_j$($\lambda$−$\lambda_o$) (360/$\lambda$) degrees, wherein $\eta_o$=lens refractive index at design frequency, and $\lambda_o$=freespace wavelength at the design frequency.

* * * * *